United States Patent
Fujita et al.

(10) Patent No.: US 10,115,700 B2
(45) Date of Patent: Oct. 30, 2018

(54) POWER MODULE, ELECTRICAL POWER CONVERSION DEVICE, AND DRIVING DEVICE FOR VEHICLE

(71) Applicant: HITACHI, LTD., Chiyoda-ku, Tokyo (JP)

(72) Inventors: Ryuusei Fujita, Tokyo (JP); Satoru Akiyama, Tokyo (JP); Hiroshi Kageyama, Tokyo (JP); Toru Masuda, Tokyo (JP); Ayumu Hatanaka, Tokyo (JP); Akio Shima, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/527,089

(22) PCT Filed: Mar. 13, 2015

(86) PCT No.: PCT/JP2015/057409
§ 371 (c)(1),
(2) Date: May 16, 2017

(87) PCT Pub. No.: WO2016/147243
PCT Pub. Date: Sep. 22, 2016

(65) Prior Publication Data
US 2018/0026009 A1   Jan. 25, 2018

(51) Int. Cl.
| | | |
|---|---|---|
| *H01L 25/065* | (2006.01) | |
| *H01L 25/00* | (2006.01) | |
| *H02M 7/00* | (2006.01) | |
| *B60L 11/18* | (2006.01) | |
| *H01L 23/467* | (2006.01) | |

(Continued)

(52) U.S. Cl.
CPC ...... *H01L 25/0655* (2013.01); *B60L 11/1803* (2013.01); *H01L 23/467* (2013.01); *H01L 23/49844* (2013.01); *H01L 25/00* (2013.01); *H01L 27/0629* (2013.01); *H02M 7/003* (2013.01); *H02P 27/06* (2013.01);
(Continued)

(58) Field of Classification Search
CPC ..... H01L 25/0655; H02M 7/003; H02P 27/06
See application file for complete search history.

(56) References Cited

U.S. PATENT DOCUMENTS

| | | | |
|---|---|---|---|
| 2009/0225578 A1* | 9/2009 | Kitabatake | .......... H01L 29/0696 363/132 |
| 2011/0285459 A1 | 11/2011 | Uemura | |

(Continued)

FOREIGN PATENT DOCUMENTS

| | | |
|---|---|---|
| JP | 2005-175074 A | 6/2005 |
| JP | 2006-296032 A | 10/2006 |
| JP | 2011-243847 A | 12/2011 |

*Primary Examiner* — Muhammad S Islam
(74) *Attorney, Agent, or Firm* — Miles & Stockbridge P.C.

(57) ABSTRACT

The object of the present invention is to compensate for a difference in threshold voltage between a plurality of switching devices incorporated in a power module.

The present invention solves the subject described above by mounting a switching device having a high threshold voltage in comparison with a different switching device at a location at which the temperature of the power module during operation is higher than that at another location at which the different switching device is mounted. Eventually, a power conversion apparatus of a high performance and a vehicle drive apparatus of a high performance can be provided.

10 Claims, 9 Drawing Sheets

(51) Int. Cl.
*H01L 23/498* (2006.01)
*H01L 27/06* (2006.01)
*H02P 27/06* (2006.01)

(52) U.S. Cl.
CPC ............. *H01L 2224/0603* (2013.01); *H01L 2224/49111* (2013.01); *H01L 2224/49113* (2013.01)

(56) References Cited

U.S. PATENT DOCUMENTS

2013/0214328 A1* 8/2013 Ishikawa ................ H01L 25/18
  257/140
2015/0207411 A1* 7/2015 Calhoun ............... H02M 1/088
  323/235

* cited by examiner

POWER MODULE, ELECTRICAL POWER CONVERSION DEVICE, AND DRIVING DEVICE FOR VEHICLE

TECHNICAL FIELD

The present invention relates to a power module, a power conversion apparatus, and a vehicle drive apparatus.

BACKGROUND ART

A chip of a semiconductor device is incorporated as a switching device for a power conversion apparatus. Silicon (Si) has been generally used as a material for a semiconductor device. For example, for a large capacity load such as a drive apparatus for a railway vehicle, an insulated gate bipolar transistor (IGBT) is used as a switching device from the point of view of the breakdown voltage and the current capacity. On the other hand, in recent years, research and development of semiconductor devices for which a wideband gap semiconductor such as silicon carbide (SiC) which is a compound semiconductor is used as a material have been and are being promoted. For example, development of a metal oxide semiconductor field effect transistor (MOSFET) (hereinafter referred to as SiC-MOSFET) for which SiC which has a breakdown voltage similar to that of a silicon IGBT (Si-IGBT) and whose electric resistance upon conduction can be reduced is being performed actively.

As one of characteristics of a switching device, a threshold voltage is available. The threshold voltage is a gate voltage when more than current of a fixed level flows through the switching device. For example, although an re-channel MOSFET normally is in an off state, if a positive voltage equal to or higher than the threshold voltage is applied to the gate, then the n-channel MOSFET is placed into an on state.

Patent Document 1 indicates that, where a wideband gap semiconductor is utilized for a semiconductor switching device, since a high temperature environment is required upon fabrication, it is difficult to stably fabricate the semiconductor switching device and an individual dispersion exists in the gate threshold voltage, and discloses a technology for reducing leak current of a switching device by controlling the driving voltage on the basis of a detection value of leak current of the switching device against the individual dispersion of the gate threshold voltage.

PRIOR ART DOCUMENT

Patent Document

Patent Document 1: JP-2006-296032-A

SUMMARY OF THE INVENTION

Problem to be Solved by the Invention

A plurality of switching devices are sometimes incorporated in a power module. Although current of several tens amperes can pass through one chip of a semiconductor device, for railway vehicle applications and so forth, a large capacity of several hundreds amperes is required. Therefore, a plurality of chips are connected in parallel to secure allowable current as a power module. In the technology disclosed in Patent Document 1, since the gate driving voltage is controlled, in the switching device groups connected in parallel, the gate driving voltage is applied similarly to the switching device groups connected in parallel, and the dispersion of the gate threshold voltage cannot be compensated for.

It is an object of the present invention to compensate for a difference in threshold voltage between a plurality of switching devices incorporated in a power module.

Means for Solving the Problem

The present invention solves the subject described above by mounting a switching device, which has a high threshold voltage in comparison with the other switching devices, at a location at which a temperature during operation is higher than that at locations at which the other switching devices are mounted.

Effect of the Invention

According to the present invention, the difference in threshold voltage between the plurality of switching devices incorporated in the power module can be compensated for. Eventually, a power conversion apparatus of a high performance and a vehicle drive apparatus of a high performance can be provided.

MODES FOR CARRYING OUT THE INVENTION

In the following embodiment, when necessary for the convenience of description, the embodiment is described dividing it into a plurality of sections or embodiments. However, except as especially expressly stated, the sections or the embodiments are not unrelated to each other but have such a relationship that one is a modification to part or the entirety of the other, particulars, a supplementary explanation or the like. Further, in the drawings used for description of the embodiment described below, even a plan view sometimes has slanting lines applied in order to facilitate viewing of the figure. Further, in all figures for describing the following embodiment, like elements having like functions are denoted by like reference characters in principle, and repetitive description of them is omitted. In the following, an embodiment of the present invention is described in detail with reference to the drawings.

Working Example 1

Figure 1:
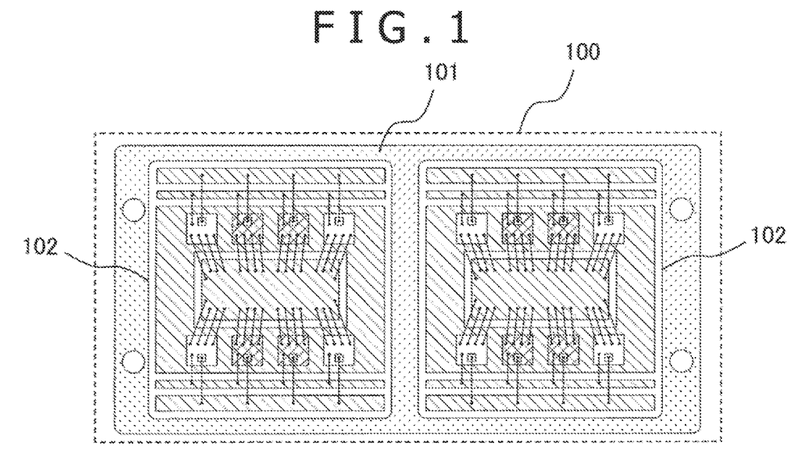
FIG. 1 is a plan view of a power module of a working example 1.

FIG. 1 is a plan view of a power module 100 of a working example of the present invention. The power module 100 has a heat radiation base 101 and two insulating substrates 102. The insulating substrates 102 are joined to the heat radiation base 101 by soldering or the like. Further, though not depicted, the power module 100 has a sealing resin member which coats the insulating substrates 102. It is possible to mount a plurality of insulating substrates 102 on the heat radiation base 101 in response to a current capacity required for a power conversion apparatus to increase the current capacity of the power module 100. Accordingly, although two insulating substrates 102 are incorporated in the power module 100, the number of insulating substrates 102 to be mounted on the heat radiation base 101 may be set to one or three or more. Also it is possible to increase the current capacity of the power conversion apparatus by connecting a plurality of power modules 100 in parallel.

Figure 2:
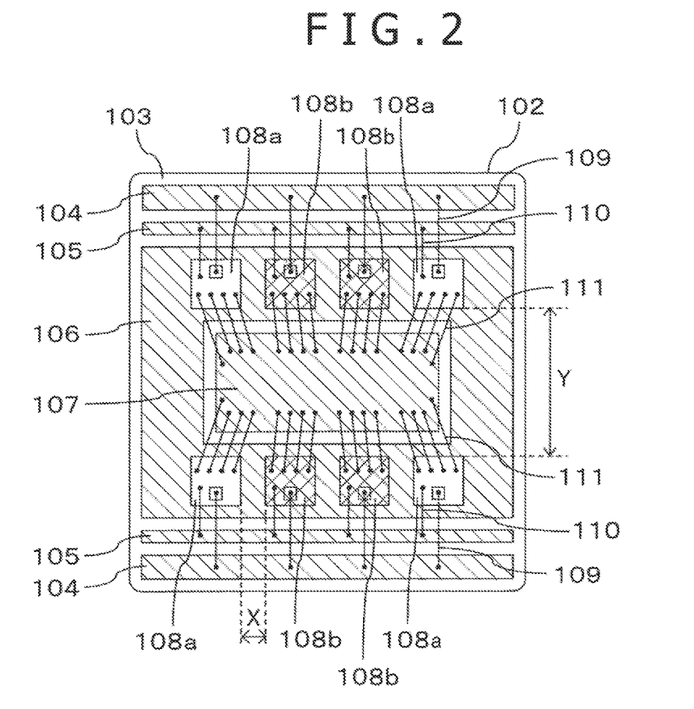
FIG. 2 is a plan view of an insulating substrate incorporated in the power module of FIG. 1.

FIG. 2 is a plan view of an insulating substrates 102 of the power module 100 depicted in FIG. 1. The insulating substrate 102 has gate wiring patterns 104, source sense wiring patterns 105, a drain wiring pattern 106 and a source wiring pattern 107 formed on an insulating layer 103. To the drain wiring pattern 106, four first switching devices 108a and four second switching devices 108b are joined by soldering or the like. Also it is possible to join, to the drain wiring pattern 106, the four first switching devices 108a and the four second switching devices 108b by a sintered metal.

The first switching devices 108a and the second switching devices 108b are SiC-MOSFETs. The second switching devices 108b have a threshold voltage higher than that of the first switching devices 108a. Here, that the second switching devices 108b have a threshold voltage higher than that of the first switching devices 108a is based on comparison in specific threshold voltage between the second switching devices 108b and the first switching devices 108a, and for example, at a room temperature (25° C.), the second switching devices 108b are higher in threshold voltage than the first switching devices 108a. It is to be noted that, where there is no necessity to distinguish each first switching device 108a and each second switching device 108b from each other, each of them is referred to as switching device 108.

The switching device 108 is a chip and has, in the present working example, a square shape with a side of 8 mm. The size of the switching device 108 is not limited to that described above, and the switching device 108 may have a square shape with a side of 5 to 20 mm or may have a quadrangular shape. Here, on the insulating substrate 102, an array of chips arranged in order of a first switching device 108a, a second switching device 108b, another second switching device 108b and another first switching device 108a is provided in each of two rows. In each row, the distance X between adjacent ones of the switching devices 108 is 5 mm. Meanwhile, the distance Y between the rows is 25 mm. In the present working example, since the distance Y which is a horizontal distance between the rows is great, little heat transfer occurs between the rows, and the influence of heat emitted from a switching device 108 on a different switching device 108 can be considered independently of each other for each row. As depicted in FIG. 2, the first switching devices 108a are disposed at the opposite ends of each row, and the second switching devices 108b having a higher threshold voltage than that of the first switching devices 108a are disposed rather near to the center of each row. In other words, the second switching devices 108b having a higher threshold voltage than that of the first switching devices 108a are sandwiched by the other switching devices 108 neighboring therewith. In contrast, the first switching devices 108a having a lower threshold voltage than the second switching device 108b are not disposed in a sandwiched relationship by the other switching devices 108. Accordingly, each second switching device 108b has a number of neighboring switching devices 108 greater than those of each first switching device 108a. Further, each second switching device 108b having a higher threshold voltage than that of each first switching device 108a is disposed rather near to the center of the insulating substrate 102, at which a high temperature is likely to occur when the power conversion apparatus operates.

Each switching device 108 is connected to a gate wiring pattern 104, a source sense wiring pattern 105 and the source wiring pattern 107 through a gate wire 109, a source sense wire 110 and source wires 111, respectively. The eight switching devices 108 on the insulating substrate 102 use the common gate wiring patterns 104, common source sense wiring patterns 105, common drain wiring pattern 106 and common source wiring pattern 107 such that the eight switching devices 108 on the insulating substrate 102 are connected in parallel to each other. Since each switching device 108 is a MOSFET and has a body diode, the body diode of the switching device 108 can be used as a freewheel diode, and the power conversion apparatus can be caused to operate without incorporating an external freewheel diode.

Figure 3A:
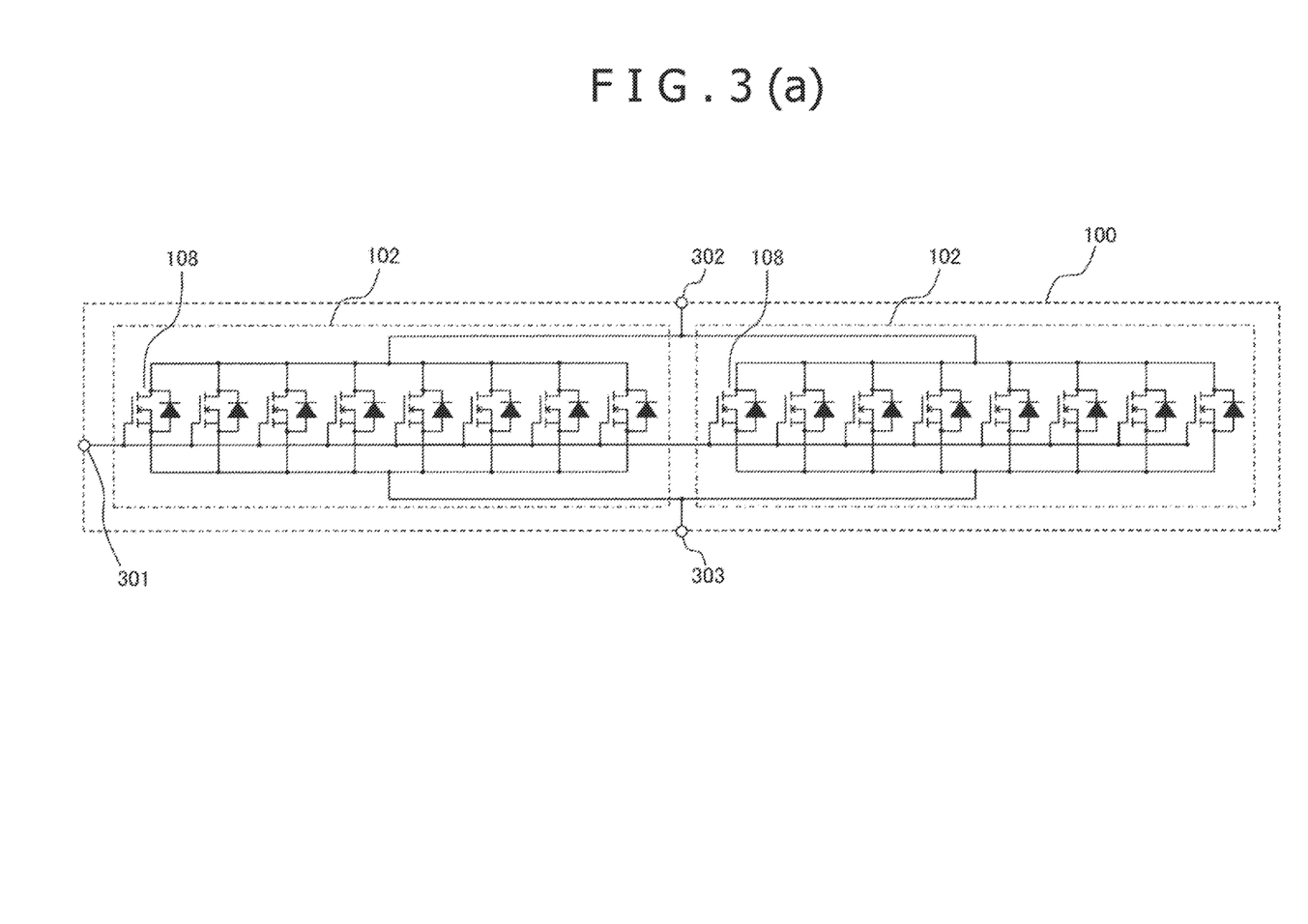
FIG. 3(a) is an example (1-in-1 module) of a circuit diagram of the power module of the working example 1.
Figure 3B:
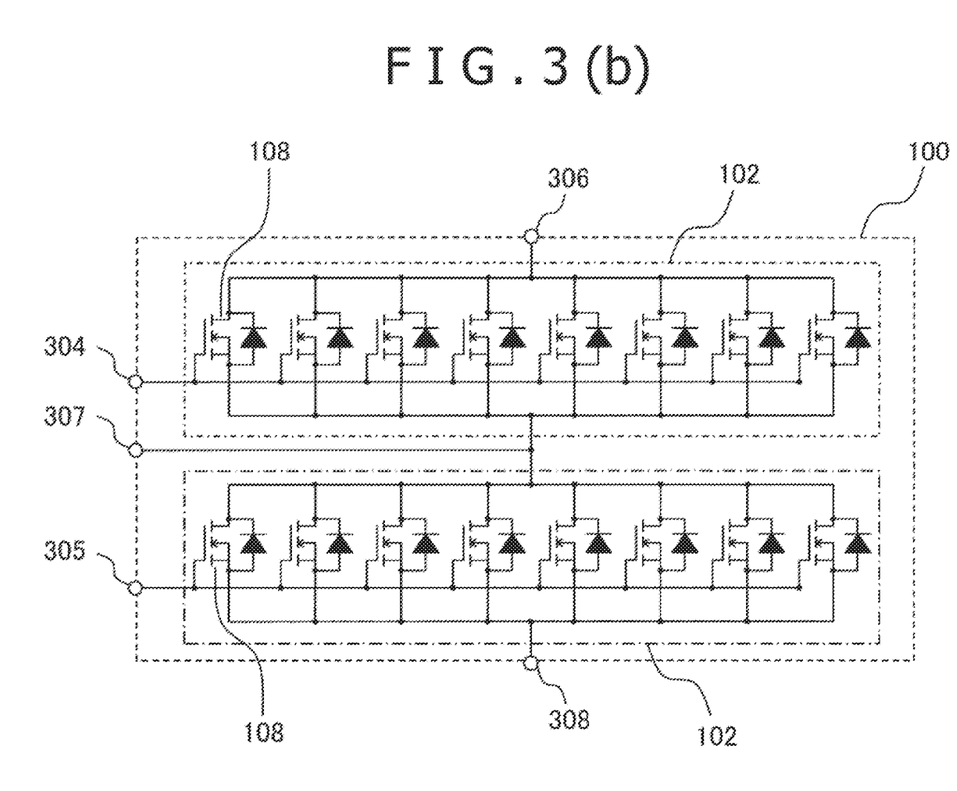
FIG. 3(b) is an example (2-in-1 module) of a circuit diagram of the power module of the working example 1.

FIGS. 3(a) and 3(b) depict circuit diagrams of the power module 100 of FIG. 1. In FIGS. 3(a) and 3(b), a connection relationship of the eight switching devices 108 on different insulating substrates 102 in the power module 100 is illustrated.

FIG. 3(a) depicts an example of a 1-in-1 module. By connecting the two insulating substrates 102 in parallel as depicted in FIG. 3(a), the current capacity can be increased. In the 1-in-1 module of FIG. 3(a), the 16 switching devices 108 are connected at the gate electrode thereof to a control terminal 301. A main circuit terminal 302 and another main circuit terminal 303 are connected to the source-drain path of the switching devices 108. Further, all insulating substrates 102 in the power module 100 may not necessarily be connected in parallel. For example, it is possible to electrically short-circuit the source of one of the insulating substrates 102 and the drain of the other insulating substrate 102 to each other as depicted in FIG. 3(b) to configure a 2-in-1 module. In the 2-in-1 module of FIG. 3(b), the eight switching devices 108 on one of the insulating substrates 102 are connected at the gate electrode thereof to a control terminal 304 while the eight switching devices 108 on the other insulating substrate 102 are connected at the gate electrode thereof to another control terminal 305. A main circuit terminal 306, another main circuit terminal 307 and a further main circuit terminal 308 are connected to the source-drain path of the switching devices 108.

If the power conversion apparatus is rendered operative, then power loss occurs in the switching devices 108, and the power loss is radiated as thermal energy. Heat radiated from the switching devices 108 is transmitted to the joining solder, drain wiring pattern 106, insulating layer 103 and heat radiation base 101 by heat conduction and is radiated from the rear face of the heat radiation base 101 to a heat sink or the like. Although the transfer of heat occurs almost in a vertical direction to the face of the heat radiation base 101, heat transfer occurs also in a horizontal direction. Accordingly, where a plurality of chips are disposed, since heat is transmitted from peripheral chips, the temperature is likely to become high in comparison with that in an alternative case in which only one chip is disposed. As the density of chips increases, the temperature is likely to become higher, and a chip disposed nearer to the center is more likely to become high in temperature in comparison with a chip disposed at an end location.

Since a MOSFET has a characteristic that the threshold voltage decreases as the temperature increases, if the threshold voltage at the same temperature is equal among all chips, then during operation of the power conversion apparatus, a chip disposed rather near to the center exhibits a decreased threshold voltage by an amount as the temperature thereof increases by heat from other chips. Accordingly, a dispersion in flowing current occurs between chips depending upon the difference in variation amount of the threshold voltage arising from the difference in temperature. Since, at a chip disposed rather near to the center, the threshold voltage is decreased by heat from other chips, the current further increases. Therefore, the heat generation amount increases thereby to further decrease the threshold voltage, and as a result, the dispersion of current between chips increases.

In contrast, in the power module 100 of the present working example, although, during operation of the power conversion apparatus, the temperature of the second switching devices 108b disposed rather near to the center of each row become higher than that of the first switching devices 108a disposed on the opposite ends of the row, since the threshold voltage at the same temperature is higher at the second switching devices 108b than at the first switching devices 108a, during operation, the difference in threshold voltage between the second switching devices 108b and the first switching devices 108a is compensated for thereby to suppress the current dispersion.

Figure 4A:
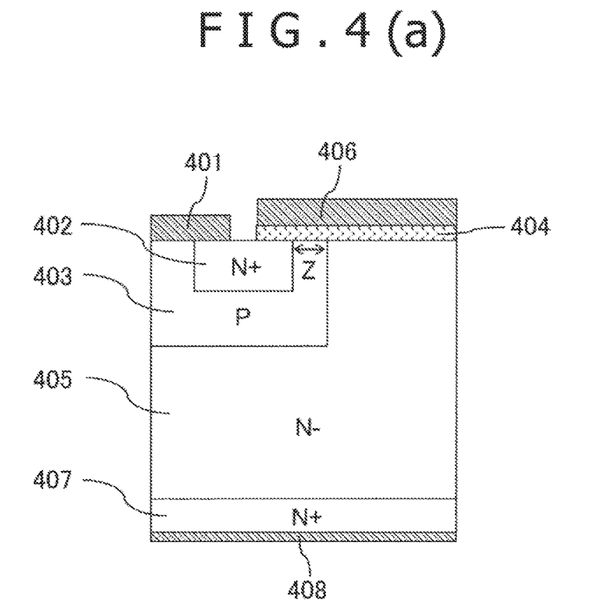
FIG. 4(a) is a sectional view of an example (in the case of a DMOSFET) of a switching device mounted on the insulating substrate of the working example 1. (a) depicts a DMOSFET, and (b) depicts a trench structure MOSFET.
Figure 4B:
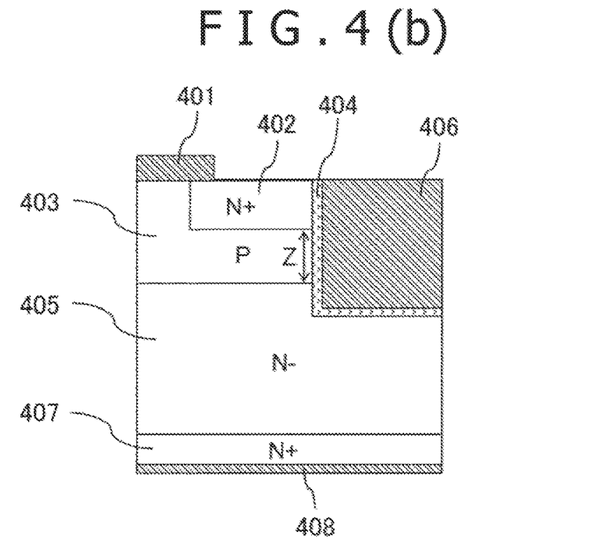
FIG. 4(b) is a sectional view of an example (in the case of a trench structure MOSFET) of a switching device mounted on the insulating substrate of the working example 1.

FIGS. 4(a) and 4(b) are sectional views of a switching device 108. FIG. 4(a) depicts an example in the case of a vertical MOSFET having a double diffusion metal oxide semiconductor (DMOS) structure, and FIG. 4(b) depicts an example in the case of a vertical MOSFET having a trench structure.

In the MOSFETs of FIGS. 4(a) and 4(b), an N+ layer 402 and a P layer 403 are connected to a source electrode 401. In the MOSFETs of FIGS. 4(a) and 4(b), the P layer 403 contacts with a gate insulating film 404 and an N− layer 405 which assures the breakdown voltage and the gate insulating film 404 contacts with a gate electrode 406 while the N− layer 405 is formed on an N+ substrate layer 407. The N+ substrate layer 407 is connected to a drain electrode 408. In the present working example, the switching device 108 is an SiC-MOSFET; the N+ substrate layer 407 is an N+ type silicon carbide substrate; the N− layer 405 is an epitaxial layer of N− type silicon carbide; and the P layer 403 is a body region of the P type. While, in the present working example, the switching device 108 is an SiC-MOSFET, also it is possible to form the switching device 108 as a nitride semiconductor device formed from a nitride semiconductor layer.

In the MOSFETs of FIGS. 4(a) and 4(b), if a positive voltage equal to or higher than the threshold voltage is applied between the gate electrode 406 and the source electrode 401, then an N-channel region is formed in the P layer 403 in the proximity of the gate insulating film 404 and current flows between the drain electrode 408 and the source electrode 401. Here, in the process in which current increases from 0 to a steady value, current reaches a peak value exceeding the steady value once and then decreases and settles down to the steady value. Where the threshold value is higher, the time changing amount of current upon switching is smaller, and therefore, if the threshold voltage is different between a plurality of switching devices 108 connected in parallel, then a current dispersion occurs. Here, even where a plurality of switching devices are fabricated by the same fabrication process, the unique threshold voltage may be different depending upon the individual difference. Also it is possible to intentionally fabricate switching devices having different unique threshold voltages by changing the magnitude of the channel length Z indicated in FIGS. 4(a) and 4(b). By increasing the channel length Z, the threshold voltage can be made higher. Since the voltage between the drain electrode 408 and the source electrode 401 decreases within a period until current returns to its steady state, a period within which none of the voltage and the current is zero exists, and power loss calculated as the product of the voltage and the current occurs. Also upon turning off, power loss occurs, and also while current flowing between the drain electrode 408 and the source electrode 401 remains settled to the steady value, power loss occurs by the electric resistance between the drain electrode 408 and the source electrode 401.

The trench structure depicted in FIG. 4(b) can reduce the time period required for switching to reduce power loss by reducing the capacitance between the drain electrode 408 and the gate electrode 406. However, since the time changing amount of current increases, also the current peak value upon switching increases, and where the threshold voltages are different from each other, the current dispersion increases. Although reduction of power loss upon switching and suppression of the current dispersion have a tradeoff relationship to each other in this manner, in the present working example, it is possible to eliminate the tradeoff by compensation for the difference in threshold voltage by the difference in temperature between the first switching device 108a and the second switching device 108b upon operation of the power conversion apparatus thereby to achieve satisfaction of the both of reduction of power loss and suppression of the current dispersion. Accordingly, where the switching device 108 is a trench type MOSFET, the performance of the power module 100 can be further improved.

Further, if a negative voltage is applied between the drain electrode 408 and the source electrode 401, then the potential at the P layer 403 becomes higher than that at the N+ substrate layer 407 and the N− layer 405, and consequently, current flows from the source electrode 401 toward the drain electrode 408. Accordingly, the MOSFET acts as a body diode whose anode is provided by the source and whose cathode is provided by the drain of the MOSFET. In this manner, in the present working example, also when current flows to the body diode of the MOSFET, power loss occurs and the switching device 108 generates heat. Accordingly, where the body diode of the switching device 108 is used as a freewheel diode as in the case of the power module 100 of the present working example, further improvement in performance of the power module 100 can be anticipated.

Figure 5A:
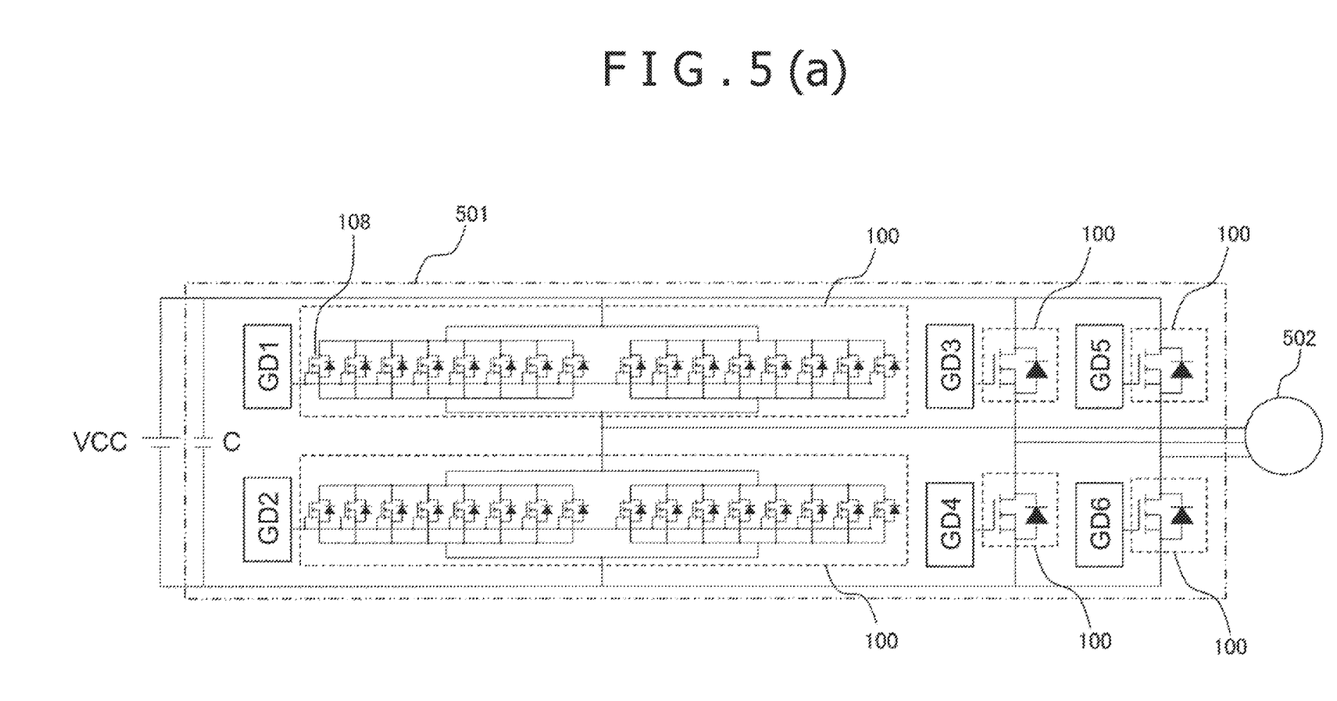
FIG. 5(a) depicts a vehicle drive apparatus of the working example 1.
Figure 5B:
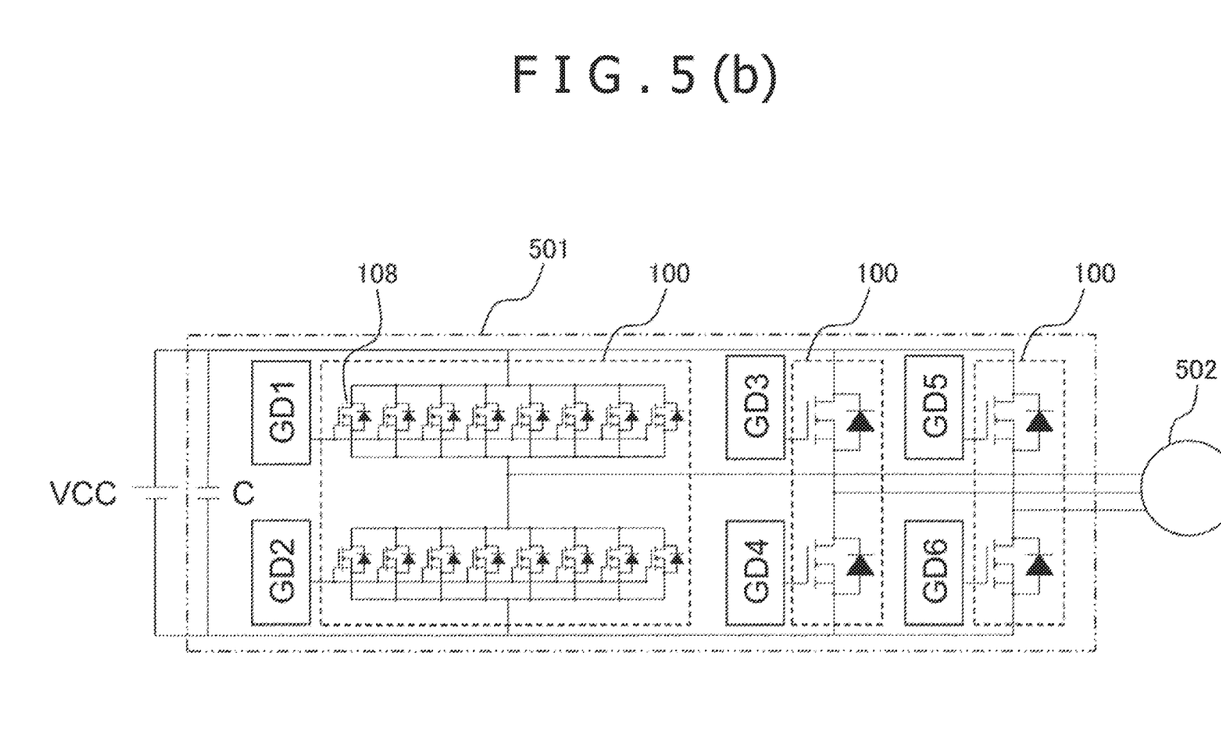
FIG. 5(b) depicts the vehicle drive apparatus of the working example 1.

FIGS. 5(a) and 5(b) depict circuit diagrams of a vehicle drive apparatus which includes the power module 101 of the present working example. FIG. 5(a) depicts an example where a 1-in-1 module is provided, and FIG. 5(b) depicts an example where a 2-in-1 module is provided. Each of the vehicle drive apparatus depicted in FIGS. 5(a) and 5(b) has a power conversion apparatus 501 and a motor 502 as a load. The motor 502 can rotate driving wheels of a railway vehicle or an automobile. The power conversion apparatus 501 has, as a circuit, switching device groups S1 to S6, diodes, and a capacitor C for stabilizing a power supply voltage VCC to be supplied. The diodes are built in the switching device groups S1 to S6. Although no inductor is depicted in FIGS. 5(a) and 5(b), the inductance of the motor 502 as a load can be utilized.

Each of the switching device groups S1 to S6 is a switching device group configured by connecting a plurality of switching devices 108 in parallel. It is to be noted that, in FIGS. 5(a) and 5(b), each of the switching device groups S3 to S6 is indicated by one switching device as a representative to facilitate understandings of the figures. Gate driving circuits GD1 to GD6 are gate driving circuits for driving the switching device groups S1 to S6, respectively. In FIG. 5(a), one power module 100 is incorporated in each of the switching device groups S1 to S6. In FIG. 5(b), one power module 100 is incorporated in the switching device group S1 and the switching device group S2 and one power module is incorporated in the switching device group S3 and the switching device group S4 while one power module 100 is incorporated in the switching device group S5 and the switching device group S6.

The switching device groups S1 to S6 repeat switching on and off in response to a signal outputted from the gate driving circuits GD1 to GD6, respectively. Three sets of series connections of two switching device groups are connected in parallel to the power supply voltage VCC. Wiring lines are connected from a connection point between the switching device groups of each set to the motor 502 which is a load.

Two switching device groups (for example, S1 and S2) connected in series are not placed into an on state simultaneously. If the switching device group S1 turns off, then the switching device group S2 turns on after a fixed period of time called dead time elapses. Within the dead time period, current flows to the body diodes of the switching device group S1 or the switching device group S2 in response to the direction of load current. This similarly applies to the switching device groups S3 and S4 and to the switching device groups S5 and S6.

The power conversion apparatus 501 converts DC power into three-phase AC power and supplies the power to the motor 502 which is a load. If operation of at least one of the switching device groups S1 to S6 becomes unstable, then the power conversion apparatus 501 can no more supply power suitable for the motor 502 which is a load. In the power conversion apparatus 501 of the present working example, since the switching device groups S1 to S6 operate stably by the compensation for the threshold voltage described above, enhancement in reliability of the power conversion apparatus and the vehicle drive apparatus can be implemented.

Figure 6:
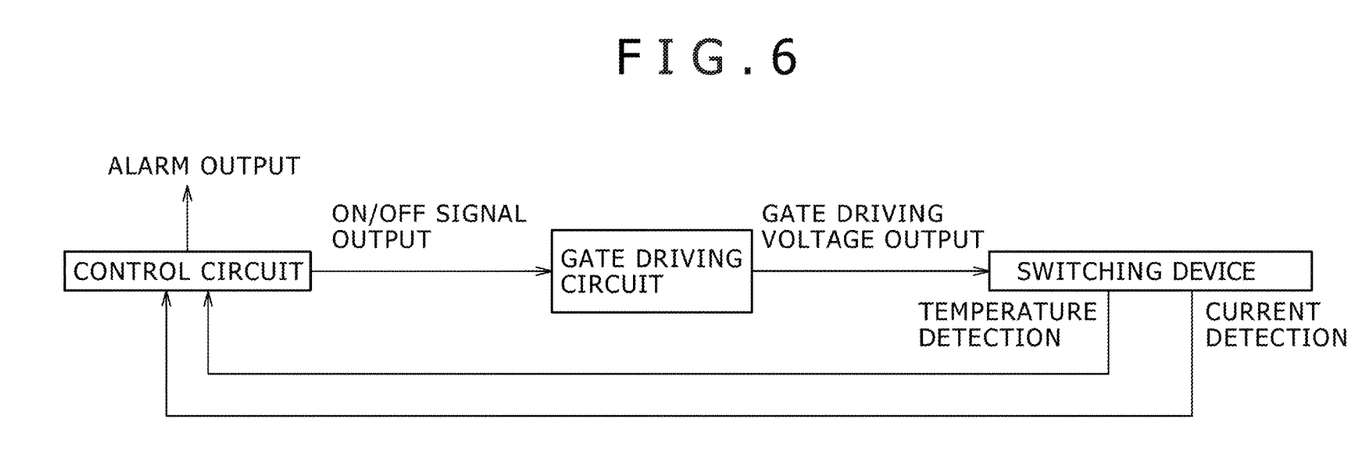
FIG. 6 is a block diagram of a protection system for a power conversion apparatus of the working example 1.

FIG. 6 is a block diagram of a protection system for the power conversion apparatus 501 of the present working example. In the power conversion apparatus 501, a temperature or current of the switching device 108 is detected and inputted to a control circuit, by which control of an alarm output or a gate driving voltage is performed on the basis of a result of an arithmetic operation. For example, if overheating or overcurrent occurs, then operation of the power conversion apparatus 501 can be stopped by turning off all of the switching devices 108. For detection of current, a current detector such as a shunt resistor or a current transformer (CT) can be used. From the current detector, sense current approximately equal to one several thousandth to one several ten thousandth of main current flowing between the drain wiring pattern 106 and the source wiring pattern 107 is outputted through the source sense wiring pattern 105. By detecting the sense current using the current detector, the main current can be estimated. Further, by building a current sensing device and a temperature detection device in each switching device 108, the protection system can monitor the situation of compensation for a threshold voltage by a temperature difference between the switching devices 108 connected in parallel.

Working Example 2

Figure 7:
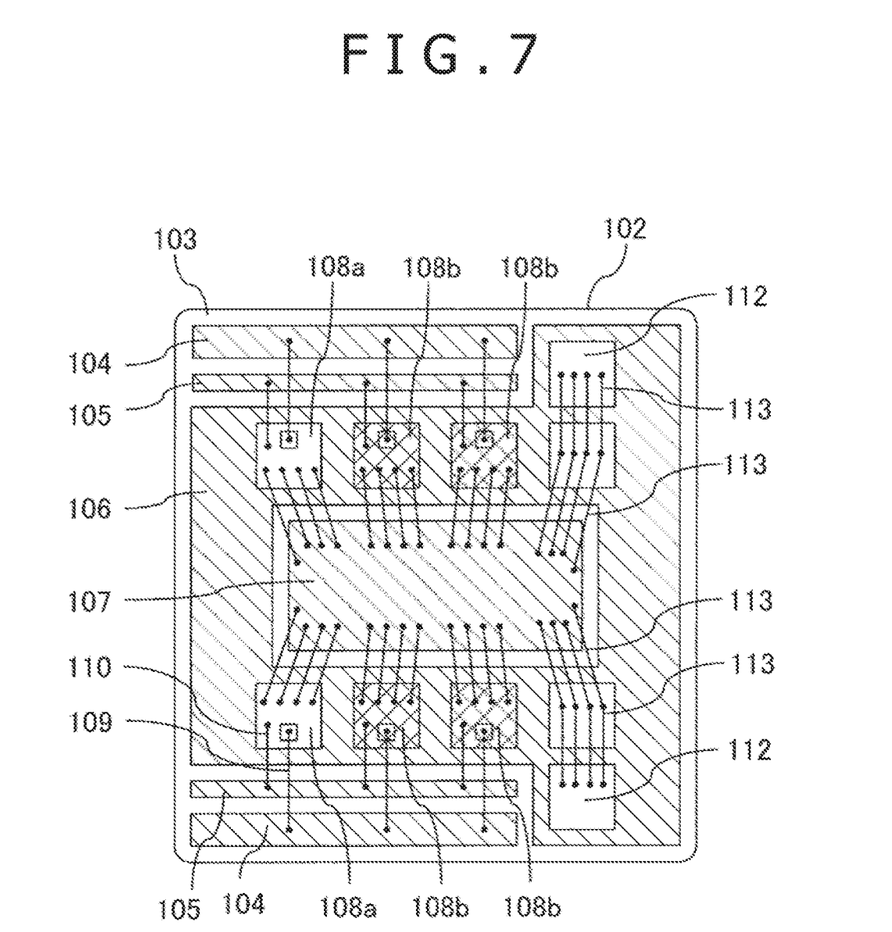
FIG. 7 is a plan view of an insulating substrate of a working example 2.

FIG. 7 depicts disposition of chips on an insulating substrate in the present working example. In the working example 1, since the body diode in each switching device 108 is used as a freewheel diode, no separate diode chip is required. However, in the present working example, diodes 112 are mounted separately on the insulating substrate 102 as depicted in FIG. 7. Here, each switching device 108 is not limited to a MOSFET. The switching device 108 may be a device having a function for changing over the current between on and off such as an IGBT (insulated gate bipolar transistor). Especially, where the switching device 108 does not have a body diode like an IGBT, it is essentially required to incorporate the diodes 112.

Incorporation of the switching devices 108 is similar as in the working example 1. The diodes 112 are joined to the drain wiring pattern 106 formed on the insulating substrate 102 by soldering or the like such that the cathode of the diodes 112 and the drain of the switching devices 108 are electrically connected to each other. The anode of the diodes 112 is connected to the source wiring pattern 107 through anode wires 113 and is electrically connected to the source of the switching devices 108.

Three switching device 108 are disposed in a row, and a chip array in which two diodes 112 are arranged vertically is placed at each of two places on the insulating substrate 102 in a neighboring relationship with the switching devices 108. However, since the horizontal distance between the rows of the switching devices 108 is great similarly as in the working example 1, the influence of heat generated from the switching devices 108 can be considered independently for each row. In each row, a switching device 108 disposed at the second position from the left in FIG. 7 and sandwiched between two switching devices 108 and a switching device 108 disposed at the third position from the left in FIG. 7 and sandwiched between the diode 112 and the switching device 108 are likely to be heated to a higher temperature by heat generation from the neighboring chips during operation than the switching device 108 disposed at the left end in FIG. 7. Accordingly, the first switching device 108a is disposed at the left end, and the second switching device 108b having a threshold voltage higher than that of the first switching device 108a is disposed at the second and third positions from the left which are rather near to the center than the first switching device 108a.

Also in the present working example, the insulating substrate 102 is joined to the heat radiation base 101 by soldering or like to configure a power module 100 similarly as in the working example 1. If current flows to the switching devices 108 or the diodes 112, then power loss occurs, and the thermal energy is radiated from the rear face of the heat radiation base 101 to a heat sink or the like.

During operation of the power conversion apparatus, the temperature of the second switching device 108b disposed rather near to the center becomes higher than that of the first switching device 108a disposed at the left end. However, since the threshold voltage of the second switching device 108b at the same temperature is higher than that of the first switching device 108a, during operation, the difference in threshold voltage is compensated for and a current dispersion is suppressed. Consequently, the reliability of the power conversion apparatus is enhanced.

Working Example 3

In the present working example, neighboring disposition of the switching devices 108 is described changing the chip array from that in the working example 1 and the working example 2.

Figure 8:
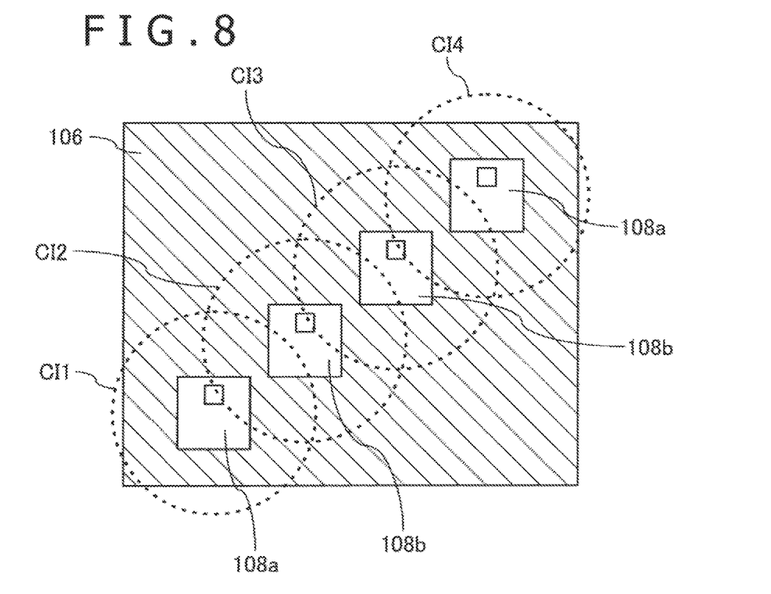
FIG. 8 is a plan view of a drain wiring pattern of a working example 3.

FIG. 8 depicts a chip array in the present working example. Four switching devices 108 are joined to the drain wiring pattern 106 by soldering or the like. A first switching device 108a, a second switching device 108b having a higher threshold voltage than that of the first switching device 108a, another second switching device 108b and another first switching device 108a are disposed in order from left below in FIG. 8. For each of the switching devices 108, a circle having the center at a crossing point of diagonals drawn on the chip and having a diameter equal to twice the length of the diagonals drawn on the chip is defined, and dotted line circles are drawn as circles CI1 to CI4.

As the number of switching devices 108 existing in each circle increases, the temperature of the switching device 108 at the center of the circle is more likely to increase by an influence of generated heat from the other switching devices 108. In FIG. 8, in each of the circuit CI2 and the circuit CI3 each surrounding a second switching device 108b, two other switching devices 108 exist, and in each of the circuits CI1 and CI4 each surrounding a first switching device 108a, another switching device exists. Therefore, in FIG. 8, a first switching device 108a is used for the chip disposed at each of the center of the circuit CI1 and the center of the circuit CI4 while a second switching device 108b is used for the chip disposed at each of the center of the circuit CI2 and the center of the circuit CI3 such that the difference in threshold voltage is compensated for by heat generation during operation of the power conversion apparatus.

In the present working example, the diameter of the circles CI1 to CI4 is set to a length equal to twice the length of the diagonals of the chip, and if a different switching device exists in each circle, then this switching device is defined as a neighboring switching device. The magnitude of the diameter of the circle can be determined estimating the influence of generated heat from switching devices in an experiment or a computer experiment. Further, while the chips in the present working example have a square shape, if a chip has a rectangular shape, then, for example, it is possible to decide whether or not a switching device neighbors using an ellipsis which is centered at the rectangular chip and has a long axis along a direction of a long side of the rectangular shape and a short axis along a direction of a short side of the rectangular.

Working Example 4

Figure 9:
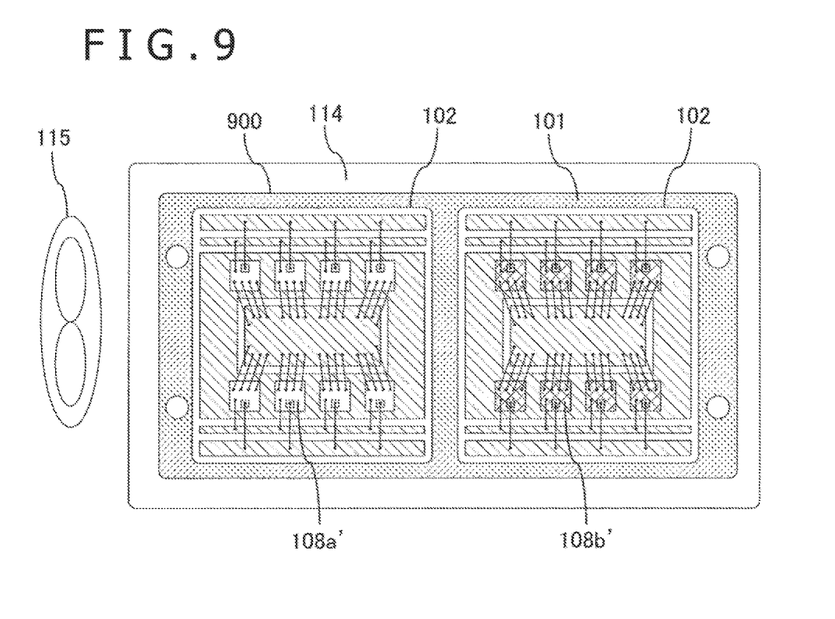
FIG. 9 is a plan view of a power module and a cooling system of a working example 4.

FIG. 9 is a plan view of a power conversion apparatus and a cooling system of the present working example. In the power conversion apparatus of FIG. 9, silicon grease or the like is applied to a heat sink 114, and a power module 900 is fixed to the heat sink 114 by a screw or the like from above the applied silicon grease or the like. For the enhancement of the heat dissipation, a cooling fan 115 is provided as a cooler in the proximity of the heat sink 114. Here, a chip disposed on the leeward side of cooling wind from the cooling fan 115 which is a cooler for cooling the air is liable to have a higher temperature during operation of the power conversion apparatus than another chip disposed on the windward side. In the power module 900 of the present working example, a first switching device 108a' is disposed on the windward side while a second switching device 108b' having a higher threshold voltage than that of the first switching device 108a' is disposed on the leeward side such that the difference in threshold voltage during operation of the power conversion apparatus is compensated for thereby to suppress the current dispersion. Consequently, the power conversion apparatus can be enhanced in reliability. Further, the power conversion apparatus of the present working example can be applied to a vehicle drive apparatus, and the vehicle drive apparatus can be enhanced in reliability.

DESCRIPTION OF REFERENCE CHARACTERS

100: power module, 101: heat radiation base, 102: insulating substrate, 103: insulating layer, 104: gate wiring patterns, 105: source sense wiring pattern, 106: drain wiring pattern, 107: source wiring pattern, 108: switching device, 108a: first switching device, 108b: second switching device, 109: gate wire, 110: source sense wire, 111: source wire, 112: diode, 113: anode wire, 114: heat sink, 115: cooling fan.

The invention claimed is:

1. A power module, comprising:
a first switching device; and
a second switching device connected in parallel to the first switching device and having a threshold voltage higher than that of the first switching device,
the second switching device being mounted at a first location at which a temperature of the power module during operation is higher than a temperature of the power module at a second location at which the first switching device is mounted,
wherein each of the first switching device and the second switching device is an SiC-MOSFET.

2. The power module according to claim 1, wherein the second switching device has a channel length greater than that of the first switching device.

3. A power conversion apparatus, comprising:
the power module according to claim 1;
each of a body diode of the first switching device and a body diode of the second switching device being a freewheel diode.

4. A power conversion apparatus, comprising:
an air-cooled cooler; and
the power module according to claim 1 incorporated in the air-cooled cooler;
the first switching device being mounted on a windward side of cooling wind from the air-cooled cooler with respect to the second switching device.

5. A vehicle drive apparatus, which supplies electric power from the power conversion apparatus according to claim 3 to a motor.

6. A power module, comprising:
a first switching device;
a second switching device connected in parallel to the first switching device and having a threshold voltage higher than that of the first switching device; and an insulating substrate on which the first switching device and the second switching device are mounted, the second switching device being mounted closer to a center of the insulating substrate than the first switching device, wherein each of the first switching device and the second switching device is an SiC-MOSFET.

7. The power module according to claim 6, wherein the number of switching devices next to the second switching device is greater than the number of switching devices next to the first switching device.

8. The power module according to claim 6, wherein a diode is mounted on the insulating substrate.

9. A power conversion apparatus, comprising:
the power module according to claim 6,
each of a body diode of the first switching device and a body diode of the second switching device being a freewheel diode.

10. A power conversion apparatus, comprising: the power module according to claim 8, the diode being a freewheel diode.

* * * * *